United States Patent [19]

Grant et al.

[11] Patent Number: 5,226,361
[45] Date of Patent: Jul. 13, 1993

[54] INTEGRATED CIRCUIT MARKING AND INSPECTING SYSTEM

[75] Inventors: William R. Grant; William C. Layer; Refugio C. Morales; Deanna K. Wirz, all of Boise, Id.

[73] Assignee: Micron Technology, Inc., Boise, Id.

[21] Appl. No.: 885,935

[22] Filed: May 19, 1992

[51] Int. Cl.⁵ .............................................. B41F 17/20
[52] U.S. Cl. ........................................ 101/44; 101/43; 101/35
[58] Field of Search ............... 101/44, 43, 35; 209/583; 198/379, 401, 395

[56] References Cited

U.S. PATENT DOCUMENTS

| | | | |
|---|---|---|---|
| 3,344,900 | 10/1967 | Orop | 198/395 |
| 3,603,646 | 9/1971 | Leoff | 198/379 X |
| 3,802,559 | 4/1974 | Luchetti et al. | 209/583 |
| 4,398,457 | 8/1983 | Takahashi et al. | 101/44 |
| 4,702,163 | 10/1987 | Araki et al. | 101/35 |
| 4,981,074 | 1/1991 | Machita et al. | 101/35 |
| 5,117,963 | 6/1992 | Thayer et al. | 198/395 |
| 5,134,932 | 8/1992 | Fujino | 101/44 |

FOREIGN PATENT DOCUMENTS 082032  4/1987  Japan ................. 101/44

Primary Examiner—Edgar S. Burr
Assistant Examiner—John S. Hilten
Attorney, Agent, or Firm—Wayne E. Duffy

[57] ABSTRACT

The inventive apparatus provides for the automated marking, inspecting and handling of a variety of singulated integrated circuit devices. The apparatus includes a computerized high speed vision system with operator touchscreen interface control of a novel series of electrical and mechanical operations to automatically receive integrated circuit devices from a suitable bulk input supply and sequentially inspect, align, mark, inspect, accept or reject, cure and discharge into a suitable bulk output supply, a high volume of properly marked integrated circuit devices, packaged and ready for shipment.

12 Claims, 11 Drawing Sheets

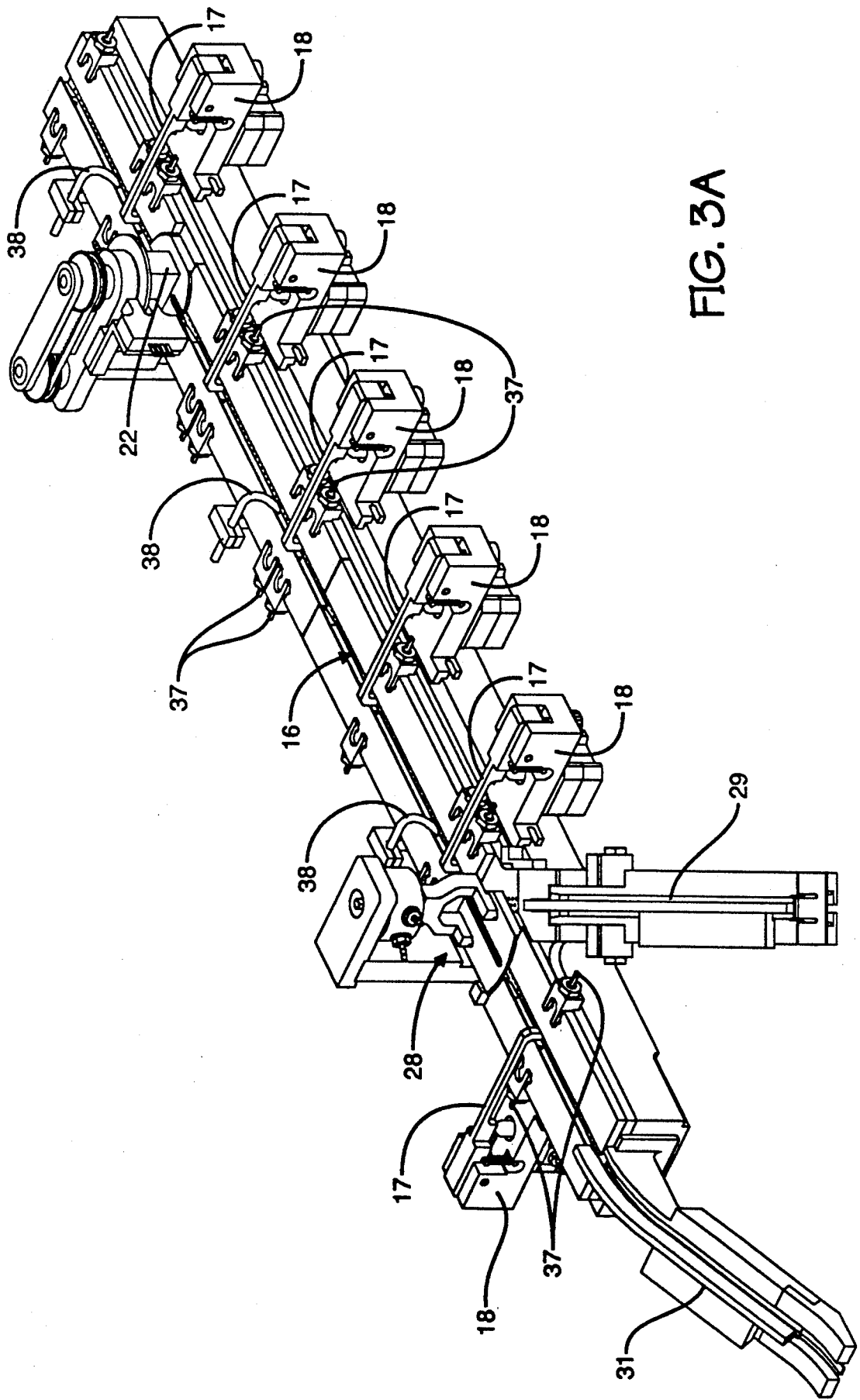

INTEGRATED CIRCUIT MARKING AND INSPECTING SYSTEM

BACKGROUND OF THE INVENTION

1. Field of the Invention

This invention relates to a system for the automated marking, inspecting and handling of singulated integrated circuit devices, based upon, but not limited to supply tube-to-shipping tube production applications.

2. Description of Prior Art

Current marking and inspecting systems for integrated circuit (IC) devices or parts use semi-automated supply tube handling, transfer or pad type printing and manual, visual inspection. Two major manufacturers of these systems are ADCOTECH and MARKEM. With these systems, dedicated operators are required to visually inspect, orient and stack the IC supply tubes that are to discharge or receive the IC devices or parts and to inspect and orient the IC parts to ensure that the pin one is in the proper position to mark the IC part. Even with the tubes correctly oriented, individual IC parts can be reversed, indexed out of the tube and marked incorrectly, without inspection. This can result in incorrect installation at the board level and cause unnecessary rework and cost to the customer.

The typical dedicated operator usually visually inspects the system operation as much as possible while running the system, feeding tubes, rejecting bad parts, removing finished product. With the demands for optimum product output and the high likelihood for significant human error during the operation of existing systems, the need for a better, faster, more reliable and economical system, with a superior product, is self evident. This invention is intended to provide these advantages.

SUMMARY OF THE INVENTION

This integrated circuit marking and inspecting system was developed to be used in conjunction with a newly developed "System for Handling of Symmetrical Supply Tubes", U.S. Pat. No. 5,117,963. However the use of this invention is not limited to tube-to-tube production applications. Integrated circuit device types that can be handled in this system include all known plastic leaded chip carriers (PLCC), small outline J-lease devices (SOJ), dual in-line devices (DIP), zig zag in line devices (ZIP) and thin small outline devices in a molded carrier ring (TSOP). Other types may be obvious to those skilled in the art.

This new marking and inspecting system uses fully automated bulk tube handling for both tube input and tube output, which as just mentioned, is not a part of this invention, but is highly desirable at this facility for the proper implementation of the invention and therefore is discussed in the preferred embodiment, herein.

The bulk input supply tube system provides properly arranged and aligned supply tubes, each filled with a plurality of individual IC parts, to be singulated by a wheel, of known design, and presented to the first station of the marking and inspection system.

The stations of the marking and inspection system, in sequence, include, but are not limited to:

1) a pin one check station, which determines the proper pin one location in the IC device or part prior to marking the part.

2) an inverter station, which inverts the orientation of the IC part, if necessary, based on information from the pin one check station, prior to proper marking of the part.

3) a part marking station, which places the desired mark upon the IC part.

4) a mark inspection station, to judge every mark against an easily definable reference standard.

5) a reject station, to divert into a separate bin any part having a defective or substandard mark on the IC part.

6) a mark curing station, wherein the IC part mark is cured.

7) a singulation, counting and loading station, which is part of the bulk output shipping tube system.

Obviously any additional stations, such as lead scan, can be introduced, at appropriate points in the operational sequence of the system to examine and accept or reject parts according to selected standards of quality or other criteria.

The novel operation of the automated integrated circuit marking and inspecting system is computer controlled by a high speed vision system, using touchscreen operator interface, with appropriate interconnection and feedback between the various stations of the system and the operating elements of the system, by the means and manner to be described herein.

The operator first loads a selected number of supply tubes or other suitable containers containing IC parts in to the bulk input hopper of the tube handling system and selected number of shipping tubes or other suitable containers in to the bulk output hopper of a second tube handling system, each attached operably to the appropriate end of the marking and inspection system. The operator next activates the combined systems, usually by use of the computerized touch screen operator interface.

The bulk tube inlet system then singulates a tube or other container, decides which side the IC leads are on, when outside the tube or container and rotates the devices, so that the IC leads are facing down in a "live bug" position. The IC part leaves the tube, and is singulated, from the succeeding IC parts and transported to the pin one check station, where the computerized vision system verifies the pin one position. If the IC part is not correctly oriented it is spun 180 degrees, horizontally, at the inverter station and then sent on to the marking station. If the pin one position is correct it passes through the inverter station, without change, and on to the marking station. The marking step is done usually by the cliche' pad ink transfer method, with commercially available equipment. The method provides a high resolution and consistent mark. Other methods can be used.

The mark is then checked against a reference standard, usually defined by the user, by use of the computerized, high speed vision system, using pattern recognition software and rejected at the mark inspection station if it is substandard. The acceptable parts pass on to the curing station. Those parts which are rejected are directed to a reject container for cleaning and possible reprocessing. The parts which are cured continue on to be singulated, counted and retubed or otherwise placed in suitable containers, for shipping or storage.

Other stations may be included at appropriate points in the process to examine and act upon the parts according to user or customer requirements.

Any integrated circuit parts which are rejected for lead or other irregularities or substandard or incorrect marks may be corrected or cleaned, and placed back into the system. Mark styles can be easily changed by removing the cliche' pad and reinstalling a different one in the markhead. If the mark standard changes or a new mark is desired, a simple software camera training procedure is executed on the new mark standard. This procedure is assisted by feedback from the CRT for the camera system mounted on the operator panel, as illustrated in FIG. 1.

In the preferred embodiment, a computer touchscreen interface is chosen for its flexibility and simplicity of operation. When in the run mode, it issues warnings and gives locations for the operator as tubes are required. If a jam occurs in the system, it shows where the jam is located and what is necessary to correct the problem. The computerized control and touchscreen interface with the operator permits quick access to a user selected spectrum of operational parameters for process information and control.

DESCRIPTION OF THE DRAWINGS

FIG. 3A shows an isometric view of the air track assembly, position sensors, stopping arms, inverter station, reject station with reject chute and tube and exiting gravity track.

DESCRIPTION OF THE PREFERRED EMBODIMENT

Figure 1:
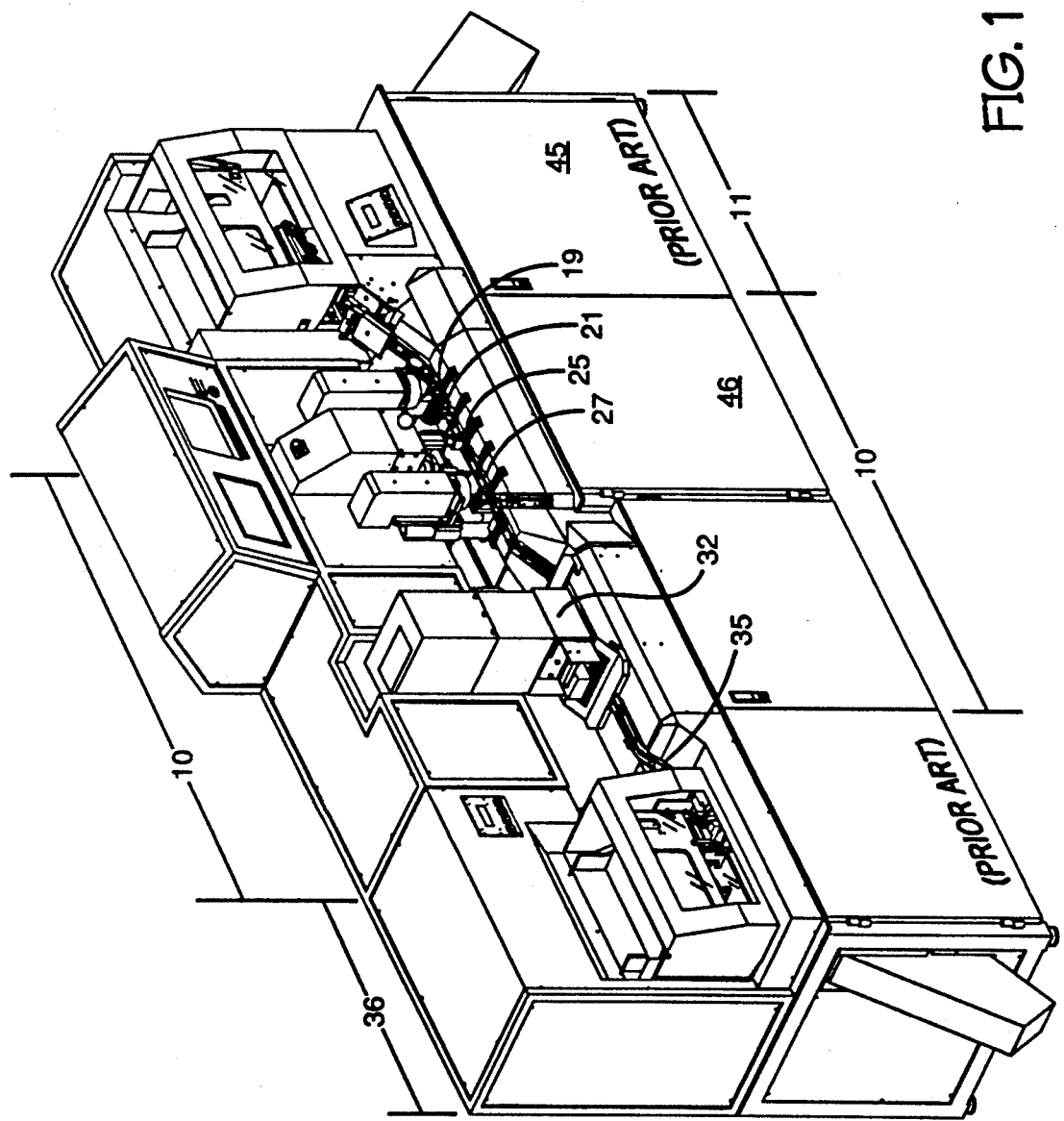
FIG. 1 shows an isometric view of the marking and inspecting system with the bulk supply tube input and bulk shipping tube output automated handling systems shown, as prior art.

Referring to FIG. 1, the integrated circuit marking and inspecting system described in this embodiment and generally designated by the numeral 10, is shown in an isometric view and solid outline. The attached, implementing, existing, known components of two similar, bulk input and bulk output systems for handling of symmetrical supply tubes are shown and are prior art and not a part of this invention. Such supply tubes are industry standard containers, which are amenable to manual or automated handling. They are variously designed to contain a number of different IC device or part configurations. A primary requirement for the optimum operation of this invention is that the IC part be delivered to the first operational station in the desired position to be able to orient the part for marking and inspecting, as will be described, then later, to be able to singulate, count and load the finished, marked parts in suitable containers for shipping.

This requirement is accomplished in this embodiment, by the incorporation, at the beginning and ending of the marking and inspecting system, of an operably adapted "System for Handling of Symmetrical Supply Tubes", U.S. Pat. No. 5,117,963. Other known means may be employed by a user familiar with the art.

Figure 2:
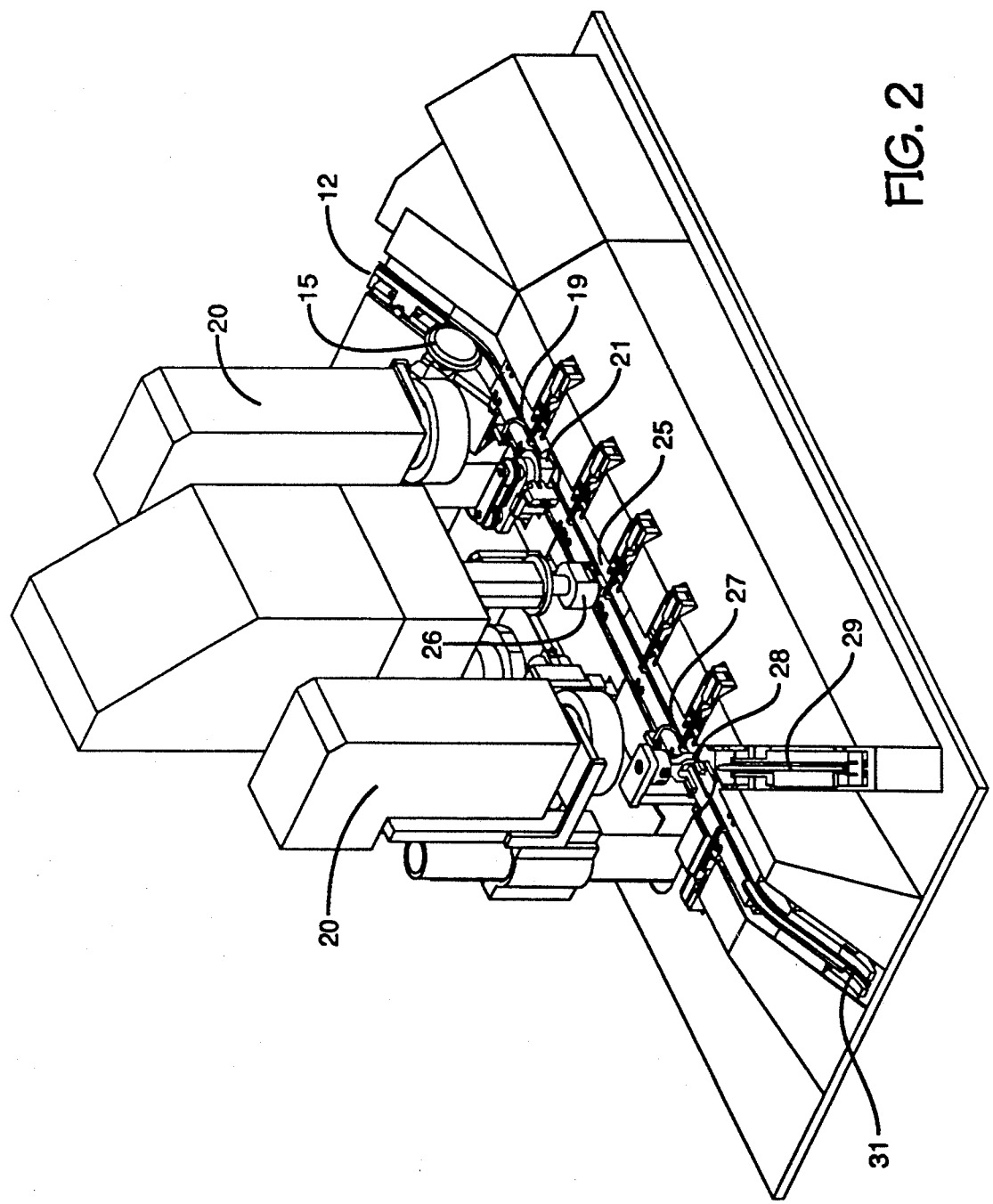
FIG. 2 shows an isometric view, from right to left, of the first five stations of the system, assembled and integrated.
Figure 3B:
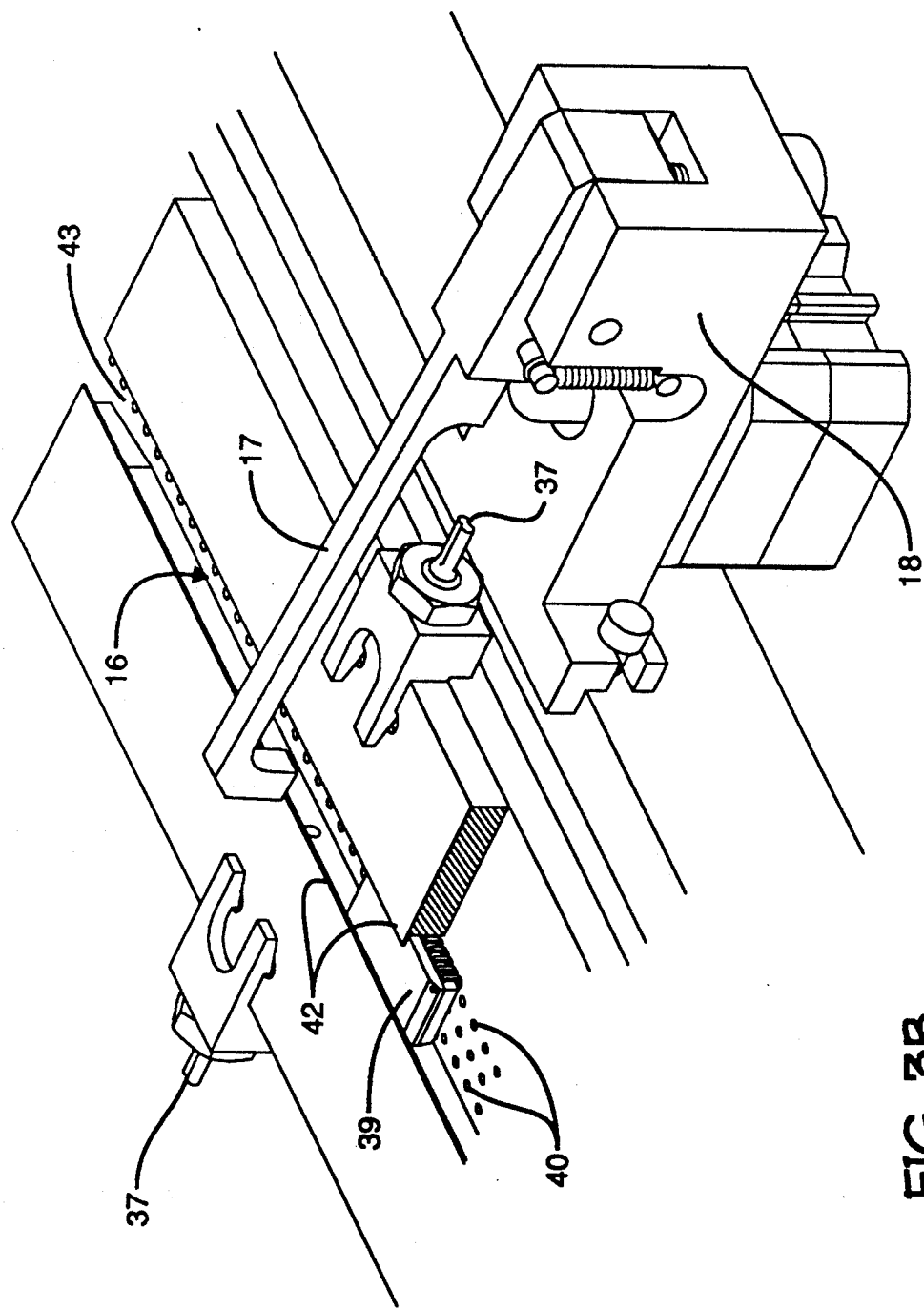
FIG. 3B shows an isometric view of a stopping arm assembly, position sensors and IC part (SOJ) on air track.
Figure 4A:
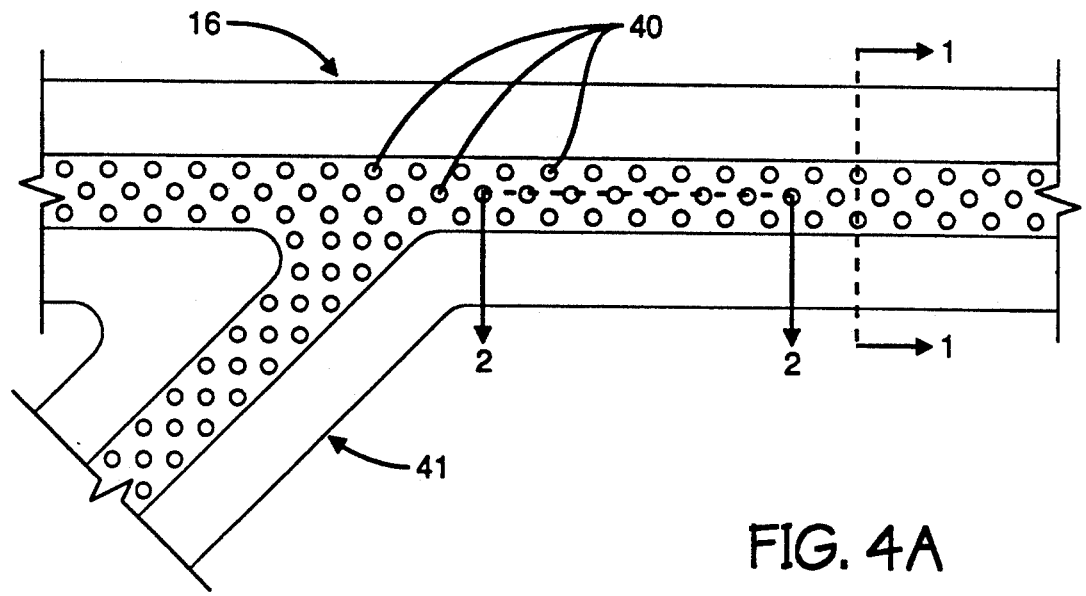
FIG. 4A shows a schematic view of the air track with the diversion track leading to the reject container.
Figure 4B:
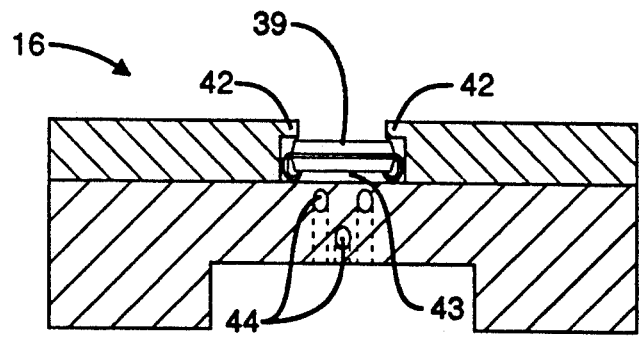
FIG. 4B is a schematic view of section 1—1 FIG. 4A, showing SOJ IC part floating in the air track, on an air cushion and restrained vertically by the confining shoulders of the track assembly.
Figure 4C:
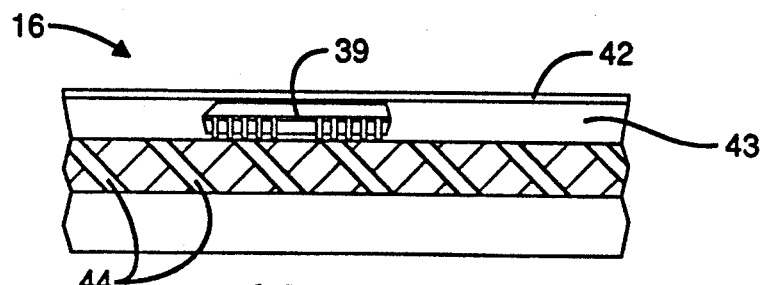
FIG. 4C is a schematic view of section 2—2 of FIG. 4A, showing an SOJ IC sitting on an air track, with the angled air vents directed to give the IC part an upward and forward movement on the track.

Referring to FIGS. 2, 3A and 3B, IC parts here shown as SOJ parts, are received from the aforementioned bulk input system 11 for handling of symmetrical supply tubes, by means of a gravity feed chute 12, which slopes generally downward, from right to left, with the leads of the IC parts facing downward in a "live bug" position, as shown in FIGS. 4B and 4C. Each of the IC parts 39 moves sequentially, from right to left, along the chute, on a downward slope, to pass beneath and in light frictional contact, with the periphery of a singulating wheel 15, spinning about a horizontal axis normal to and above the long, horizontal axis of an air track 16. The wheel rotates in the direction of travel of the IC part and causes it to singulate or separate from those IC parts immediately following in the chute and move onto a horizontal air track 16, to be described. This air track causes the part to float on a cushion of air, in a horizontal plane and forward along the longitudinal axis of the track. The forward motion of the singulated IC part is controlled by a stopping arm 17 which extends from one side of the air track assembly inward to interrupt the path of the moving IC parts and is hingably attached on its opposing end to a base 18 which, in turn is adjustably attached to the side of the air track assembly to accommodate different types of IC parts on the air track, not shown. The base 18 is mechanically and electrically designed, not shown, to control the stopping arm, which rises and falls upon computer command, to interrupt and release the movement of the IC parts as they pass along the air track.

The first position at which the IC part is stopped is known as the pin one check station 19, where a computerized high speed camera 20, here available through Itran Vision systems and of known design, which has been programmed, in a known way for pattern recognition, inspects the IC part, from above, to determine if the pin one orientation of the part is correct for the marking of the part.

Figure 5A:
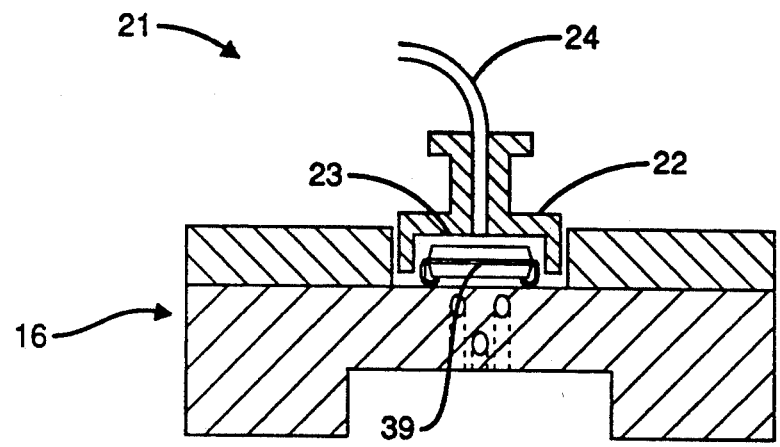
FIG. 5A is a schematic sectional side view of the rotatable IC part holder which confines the IC part resting on the air track.
Figure 5B:
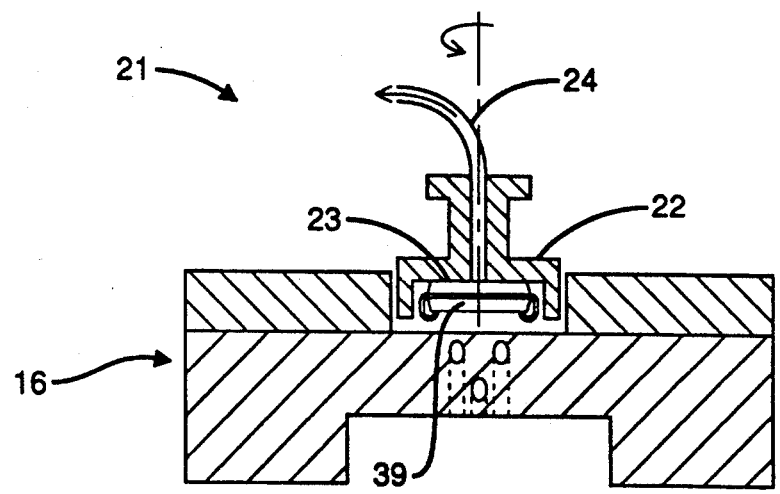
FIG. 5B is a schematic sectional side view of the rotatable IC part holder when applied vacuum holds the IC part during the horizontal rotation or inversion of the part, on the air track.
Figure 6:
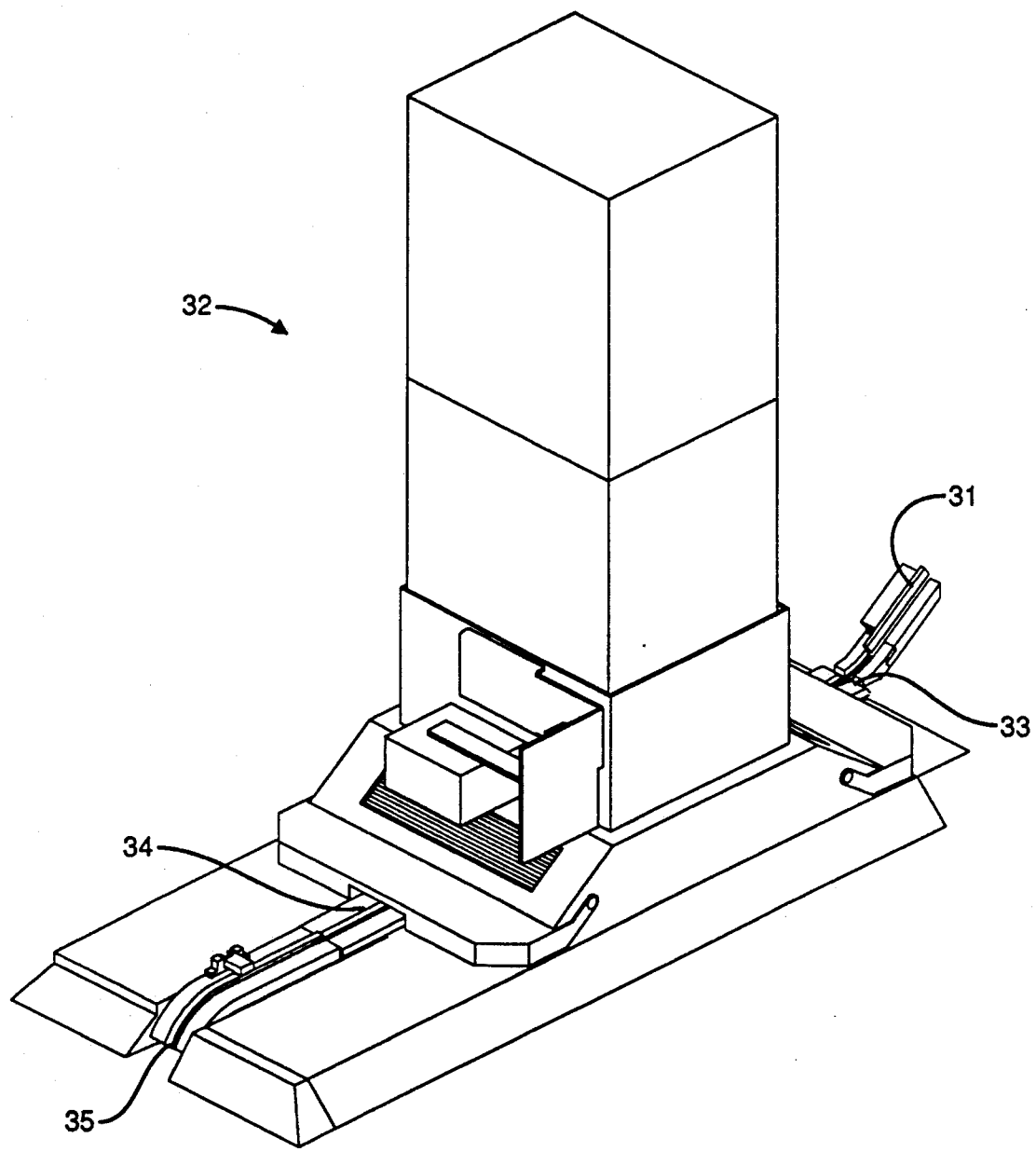
FIG. 6 is an isometric view of the marked IC part curing oven, showing the input and output track which carries the IC parts to and from the oven.

Referring to FIGS. 3A, 5A and 5B, if the orientation is wrong the stopping arm 17 releases the IC part to pass along the air track to the inverter station 21, where it enters a rotatable IC inverter means 22, which forms a part of the air track but which is independently rotatable about a vertical axis, with a part confining surface 23 in the same horizontal plane of travel as the supported surface of the IC part moving in the air track.

Referring again to FIGS. 5A and 5B, the part is held, during rotation or inversion, by a suction force, applied from above the part, through a vacuum line 24, which suction is released, upon computer command. The mechanical and electrical assembly of the inverter station is done in a known way, not shown but is designed to receive an individual IC part 39 coming from the pin one check station 19 and, if so instructed by the computerized high speed vision system, to rotate or invert the IC part 180 degrees in a horizontal plane, to correct the perceived, improper orientation of pin one before the part proceeds to the marking station 25.

If the pin one inspection station does not, through the computerized high speed inspection system, indicate to the inverter station that such pin one position correction is necessary, the IC part passes, unaffected, through the inverter station and along the air track to the marking station 25. Referring to FIG. 2, when the IC part reaches the marking station it is held by a stopping arm 17, on the air track assembly, while marking means 26, not shown, operates a cliche' pad and stamp, to mark the IC part. When the marking step is complete the stopping arm 17 releases the IC part to travel on the air track to the mark inspection station 27, which has a second high speed computerized camera 20 which uses pattern recognition technology to compare the mark on the IC part with a defined standard. If the mark is substandard or otherwise defective the part is released by the stopping arm 17, to travel on the track to the reject station 28, where a reject chute 29 opens to receive the rejected part, which falls by gravity into a container, not shown, for subsequent cleaning and reprocessing, whenever appropriate.

If the mark meets the defined standard the IC part moves through the reject station, leaving the air track to travel by gravity on a down sloping track 31, into a curing oven station 32, of generally box-like design and having inlet 33 and outlet 34 ports for the IC parts on opposing sides of the oven, wherein the parts are cured by ultraviolet light or other known methods, not shown. The IC parts are moved through the oven by a flexible stainless steel belt, not shown, which has a rib extending along its central axis, which supports the IC parts from underneath, as the belt moves at a constant speed through the oven.

After curing of the mark, the IC part is gravity fed on the down sloping track 35, to enter an existing automated bulk output system 36 for the handling of empty symmetrical supply tubes. System 36 is operably attached to the outlet end of system 10 to receive, singulate, count, the individual IC parts and load them into shipping tubes which have been aligned and arranged to accept the IC parts, for subsequent storage or shipping.

Referring to FIGS. 1, 2 and particularly 3A and 3B, the air track assembly of system 10, has located, at appropriate points along the track, a sequence of light activated sensors 37, which are adjustably located on opposing sides of the air track assembly to sense the presence of each part as it reaches a predetermined position and command the stopping arm to stop and hold or release or pass the part being processed. The sensors also command the parts immediately following the part being processed to stop or proceed as the plurality of IC parts move along the track assembly of system 10.

When the IC part that is being processed is stopped and held by one of the stopping arms, it tends to bounce backward from the point of impact with the arm. This tendency is overcome by air from an air jet 38, directed at the part from above and behind it, as seen in FIG. 3A. This serves to dampen the recoil and hold the part stationary and against the stopping arm, on the track, while it is being examined or otherwise being processed.

These sequential steps are controlled and executed by a computerized high speed vision system, which has touch screen interface with the operator, so that the operator can observe the operation of the equipment, correct any malfunctions and maintain operation of the system. The overall operation of combined systems 10, 11 and 36 is operably integrated, both mechanically and electrically and is powered at appropriate points by external power, not shown.

Referring to FIG. 4A, which shows a top schematic view of the air track, the bottom of the air track is filled with multiple openings 40 for the passage of air upward to provide an air cushion upon which the IC parts can float and travel. FIG. 4A shows a side branch 41 of the track which provides for the diversion of IC parts which may be defective or for other processing, not shown.

Referring to FIG. 4B, a SOJ IC part 39 is shown being held up against the confining shoulders 42 on opposing, parallel sides of the air track assembly. The shoulders prevent the part from popping up from the track cavity 43, but are designed to permit the IC part to float just free from the bottom surface of the track cavity. Similarly the distance between the side walls of the cavity is chosen to limit the wobble or side travel of the IC part as it passes along the track. Track assembly is segmented, layered and adjustable in order to provide for the handling of a variety of IC parts having many different configurations and dimensions, not shown.

FIG. 4C shows the plurality of annular openings in the bottom of the air track assembly which allow a controlled flow of air to flow through parallel, angled passages 44, here 45 degrees, to exert a resultant vertical and horizontal force upon the IC parts which causes the parts to generally remain free of the bottom of the air track cavity as they are propelled forward while their top surfaces are constrained by the slightly extended shoulders at the top of the track cavity. The air which provides the cushion is filtered and dried, before entering the track assembly, to minimize possible contamination and corrosion of the IC parts.

Referring again to FIG. 1, the existing automated system 11 for handling of symmetrical supply tubes is contained in a suitable enclosed metal framework, 45 and securely and removably and operably attached to the marking and inspection system 10 in such a manner that the outlet port of system 11 matches, physically and operably, the inlet of the track assembly of system 10.

The first operation of system 10, as described previously, singulates the IC parts emerging from system 11 and passes them, individually, on to the air track assembly and to pin one station for inspection.

In the preferred embodiment, a unified, enclosed, generally rectangular, box-like metal framework, 46 contains and supports system 11 and those elements of system 10 preceding the curing oven, on one horizontal surface, which is located at a convenient operational level. The cure oven station and remaining track assembly of system 10 and the singulating, counting and loading means, not shown, of system 36 are contained in and supported on a slightly lower and convenient horizontal surface. Here again, the inlet port of system 36 is matched and removably attached, physically and operably, to the outlet end of the track assembly of system 10.

Figure 7:
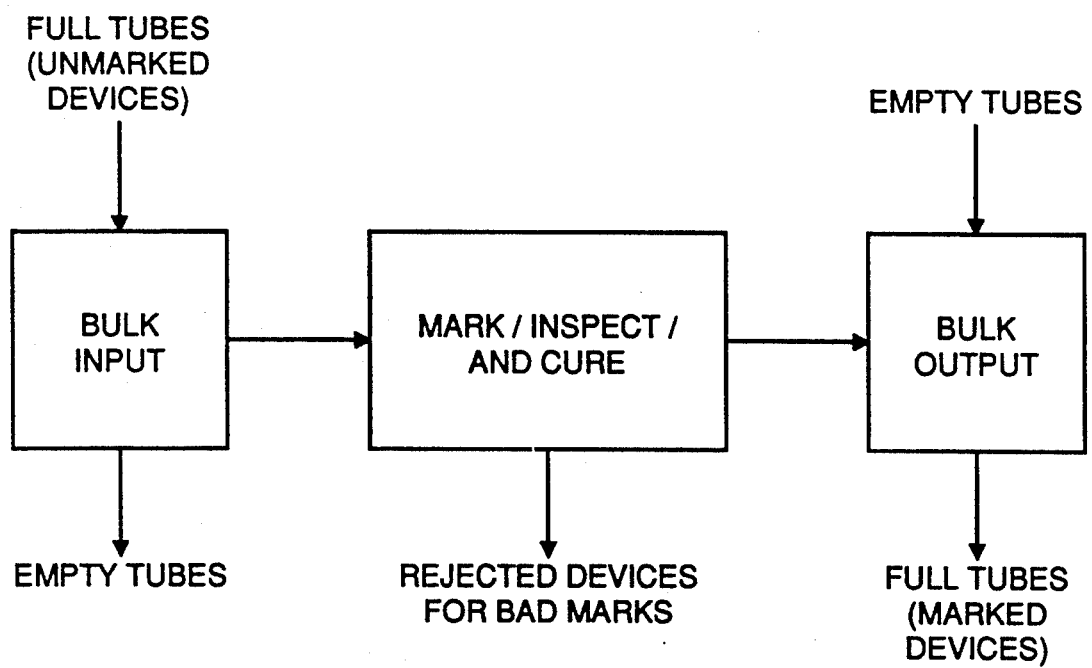
FIG. 7 is a system flow diagram showing the relationship between the bulk tube input station, the marking and inspection system and the bulk tube output station.

FIG. 7 illustrates the system flow of the combined bulk input marking and handling and bulk output systems. The computerized high speed vision system and associated computer hardware and software combine to provide a truly integrated overall system for the marking, inspection and handling of unfinished and finished IC parts.

Figure 8A:
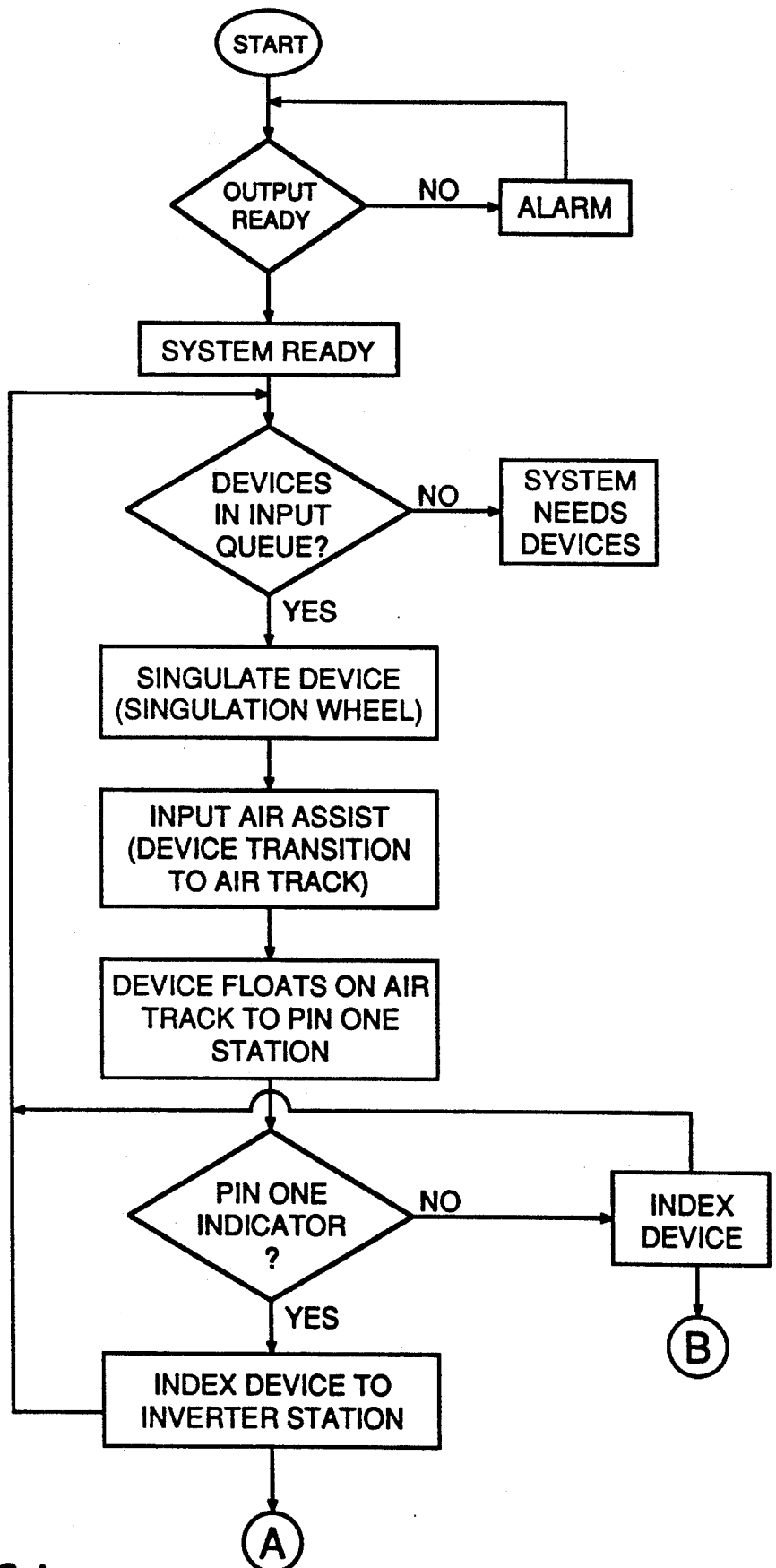
FIG. 8A shows a first part of the operational logic of the marking, inspecting and curing system, in which a circle represents a starting or continuing point, a line represents a yes or no decision event, a rectangle represents an activity and a diamond represents a query.
Figure 8B:
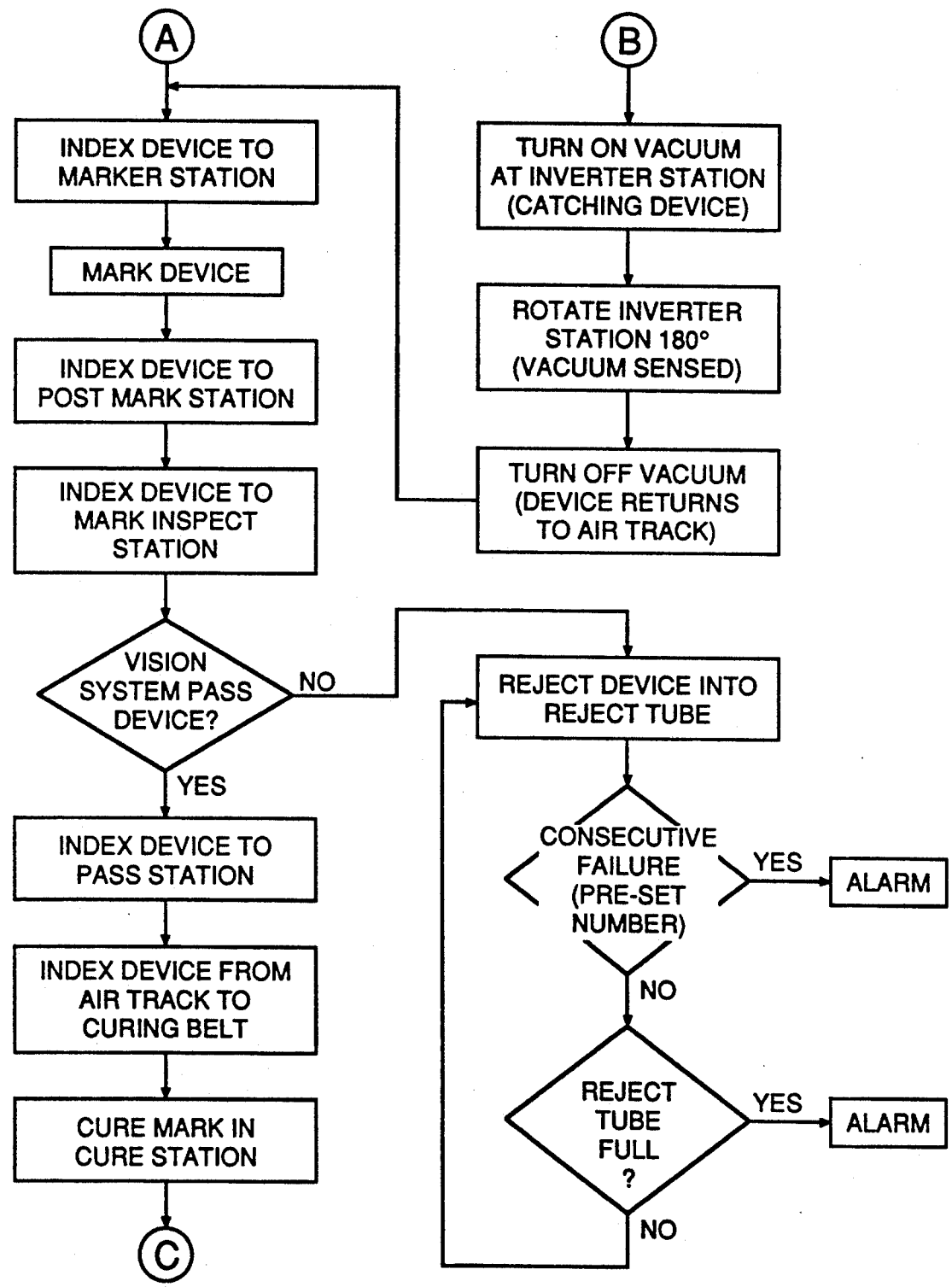
FIG. 8B shows a second part of the operational logic of the marking, inspecting and curing system.
Figure 8C:
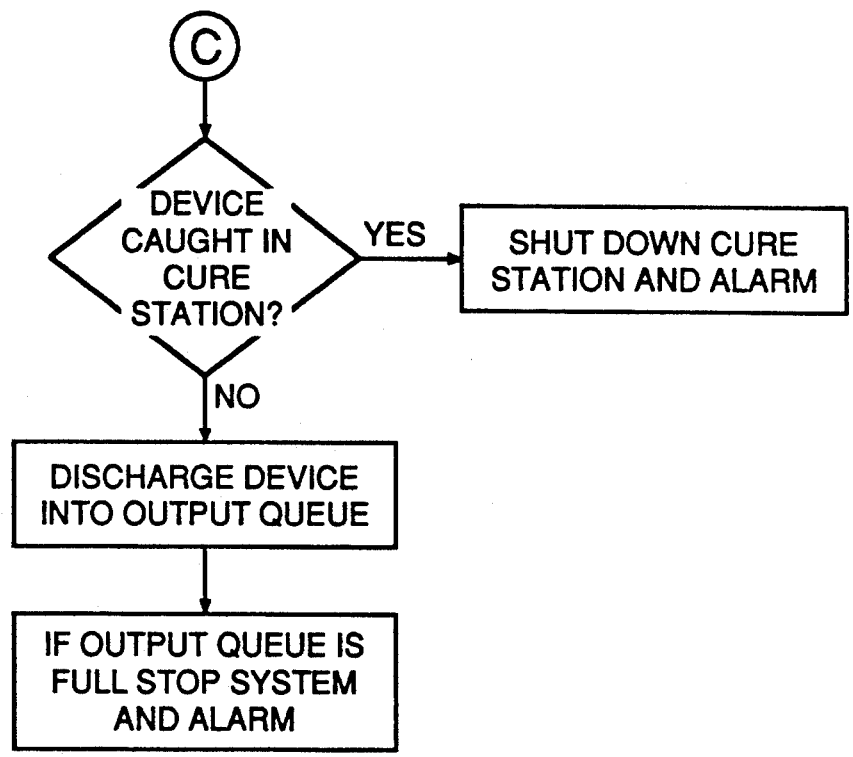
FIG. 8C shows a third part of the operational logic of the marking, inspecting and curing system.

FIG. 8 shows the system logic for the marking, inspection and handling of typical IC parts. The bulk input and bulk output systems have similar logical routines, not shown, which are included in the computer control programs utilized to operate the combined systems.

The present invention has been described in a preferred embodiment using existing supply tube bulk input and output handling technology to implement the system. Many modifications and variations may become apparent to those skilled in the art. However the scope of the invention is not limited by the above described details but only by the appended claims.

We claim:

1. An improved integrated and automated and computer controlled machine for receiving multiple individual workpieces from a suitably aligned input supply container and sensing and moving and sequentially inspecting, orienting, selectively marking, inspecting, selecting, curing and discharging the workpieces into a suitable output supply container, comprising:

a suitable workpiece input supply system, operably connected to a reference point check station with means to provide multiple properly arranged and aligned workpiece containers, each filled with a plurality of properly oriented individual workpieces, to be singulated and presented to the workpiece reference point check station;

b) said reference point check station having means for the orientation of the selected reference point prior to the marking of the workpiece;

c) an orientation station operably connected to the reference point check station, having means for correcting the orientation of the workpiece is corrected, if necessary, based upon the information from the reference point check station, and prior to the marking of the workpiece;

d) a suitable workpiece orientation means operably connected for orienting the workpiece when instructed by the reference point check station, in preparation for marking of the workpiece;

e) a workpiece marking station operably connected to the orientation station, where the selected mark is placed on the workpiece;

f) a suitable marking means for precisely and accurately placing an appropriate mark on the selected surface of the workpiece, said marking means being operably connected to the marking station;

g) a mark inspection station operably connected to the marking station and having means to compare each workpiece mark against an easily definably reference standard;

h) a reject station operably connected to the mark inspection station, having means to divert any workpiece having a mark which does not meet a predetermined standard is diverted into a separate container means;

i) a suitable diverter means to separate the defective workpiece and divert it into a separate container means for reprocessing;

j) a mark curing station operably connected to the mark inspection station having means for curing the acceptably marked workpieces;

k) a suitable curing means to permanently secure the identification mark upon the workpiece after the mark has been approved by the inspection means;

l) a singulation, counting and loading station operably connected to the curing station having means process and load the finished workpieces into an output supply container;

m) a suitable output supply container operably connected to the loading station to receive the singulated workpieces for storage and shipping;

n) a suitable automated means for sequentially and controllably moving the individual workpieces from the input supply containers to and through the various stations of the machine to the mark curing station;

o) an automated means for moving the cured workpieces through and from the curing station into the singulating, counting and loading station where they are loaded individually into output supply containers;

p) a computer controlled high speed vision system, operably connected to the machine, a touchscreen operator interface, said high vision system having means for use with said interface having appropriate interconnection and feedback between the various stations of the machine and the operating elements of the machine to inspect and monitor and control the incoming workpieces and the marks and to control the operation of the machine;

q) a computer operably programmed, powered and connected to the high speed vision system to enable operation of the machine; and r) a plurality of suitable automated stopping means operably connected to the computer and located at selected locations before and after the various stations, along the path of the moving workpieces, to provide a controlled separation and holding of the individual workpieces during the sequential operation of the machine.

2. The integrated and automated machine described in claim 1 wherein:

a) the workpiece is an integrated circuit device;

b) the reference point on the integrated circuit device is the pin one position;

c) the means for making the identification mark on the device is an ink pad printing machine which transfers an ink impression of the selected mark onto a surface of the device; and d) the means for curing the identification mark is an ultraviolet light, inclosed in a suitable oven.

3. The integrated and automated machine described in claim 1, wherein:

the workpiece input supply container and the workpiece output supply container are supply tubes appropriately and operably connected to the input and output locations of and integral to the machine.

4. The integrated and automated machine described in claim 1 wherein:

a) means for moving the singulated workpieces are moved individually in a path from the input supply container, sequentially to and through the various stations to the mark curing station, along a generally horizontal track which is slightly wider than the workpiece and which has parallel sides extending slightly above a workpiece and which has parallel sides extending slightly above a workpiece at rest thereon, with parallel shoulders on the track sides extending slightly inward toward each other to confine the vertical movement of the resting and moving workpiece;

b) the track surface having a plurality of parallel annular channels which extend angularly downward through the track, in a direction generally opposing the direction of movement of the workpieces along the track, to reach a plenum under the track which contains compressed air;

c) a blower and plenum means operably connected to the underside of the track to provide a controlled and continuous and even air flow through the plenum and angularly upward through the annular channels, sufficient to provide a resultant lifting and pushing of the workpieces, thus driving the workpieces along the track on a cushion of air while being constrained vertically by the shoulders on the sides of the track.

5. The integrated and automated machine described in claim 1 wherein:

a) the high speed vision system includes multiple computer controlled television cameras (CCTV) operably connected and located to inspect and monitor the appropriate, selected stations of the machine and to control the location and sequential movement of the workpieces and operating elements of the machine;

b) an appropriately located and operably connected said CCTV camera having means to inspect the incoming singulated workpieces to confirm the proper orientation of the workpiece prior to marking and to supply this information to the computer for appropriate action;

c) an appropriately located and operably connected said CCTV camera having means to inspect the identification mark placed on the workpiece and to determine if the mark meets the criteria of an easily definable predetermined standard; and d) a plurality of said CCTV cameras are appropriately located and operably interconnected and having means to monitor the relative positions of the workpieces on the track and in the various stations and to control the location and sequential movement of the workpieces and the operation of the various stations along the track and including the workpiece input supply system and the output supply system.

6. The integrated and automated machine described in claim 1 wherein the movable track means moves the workpieces through and form the curing station to the loading station is a stainless steel belt, driven by a pulley and which is operably connected and located within a curing station on one end and extending to the loading station on the opposing end.

7. The integrated and automated machine described in claim 1 wherein:

the workpiece reorientation means consists of a turntable, operably and controllably connected in the orientation station and has means to controllably and horizontally rotate the workpiece about a vertical axis sufficiently to properly orient the workpiece for subsequent marking, while the workpiece is being held in a stationary position by a suitable vacuum suction means applied to an underside of the workpiece through a suitable opening in the turntable means.

8. A method for the use of a improved integrated and automated and computer controlled machine having operating elements for receiving multiple individual workpieces from a suitably aligned input supply container and sensing and moving and sequentially inspecting, orienting, selectively marking, inspecting, selecting, curing and discharging the workpieces into a suitable output supply container, comprising:

a) activating and checking all of the operating elements of the machine system selected to employ said method and making any necessary adjustments;

b) loading filled workpiece input supply containers into a suitable bulk input supply means which is operably connected to the appropriate entry position of the machine system;

c) loading empty workpiece output supply containers into a suitable sulk output supply means which is operably connected to the appropriate output position of the machine system;

d) singulating the workpieces form the input supply containers as the containers are presented sequentially, in proper alignment, for singulation;

e) moving the singulated workpiece in a defined and controlled manner to a location where the workpiece can be inspected;

f) inspecting the singulated workpiece to confirm that it is properly oriented to receive a selected identification mark in a subsequent operation;

g) moving, if the workpiece is not properly oriented for marking, the workpiece in a defined and controlled manner to a location where it can be reoriented to allow proper marking;

h) reorienting the workpiece by suitable means and inspecting the workpiece to confirm the proper orientation for marking;

i) moving the properly reoriented workpiece in a defined and controlled manner to the next location, where the workpiece is to be marked with a selected identification mark;

j) moving, if the workpiece is properly oriented for marking, the workpiece in a defined and controlled manner, beyond the reorientation location and to the location where the workpiece is to be marked;

k) applying a selected identification mark precisely and accurately to a selected position on the workpiece, by suitable means;

l) moving the marked workpiece in a defined and controlled manner to a location where the mark can be inspected;

m) inspecting the mark on the workpiece and determining if it conforms in quality an location with a selected and easily definable standard;

n) moving, if the marked workpiece does not meet the selected standards for quality and location, the defective workpiece in a defined and controlled manner to a post inspection location and diverting it to a separate container for subsequent reprocessing;

o) moving, if the marked workpiece does meet the selected standard for quality and location, the workpiece in a defined and controlled manner to a location where the mark can be cured by suitable means and permanently secured to the workpiece;

p) providing a curing station for curing and securing the mark upon the workpiece by said station;

q) moving the workpiece in a defined and controlled manner to a location where it can be singulated, counted and stored by suitable means;

r) singulating, counting and loading the properly aligned and oriented workpieces into suitable output supply containers which are contained in a suitable bulk output supply means which is operably connected to the appropriate output position of the machine system;

s) providing a programmed and computer controlled high speed vision system with operator touch-screen interface, and with appropriate interconnection and feedback between the various stations of the machine and the operating elements of the machine to inspect and monitor and control the movement and location and orientation and marking and quality of the workpieces and the operation of the machine during the execution of the method;

t) providing the high speed vision system with multiple computer controlled television cameras appropriately located to observe, inspect and control workpieces during the execution of the method;

u) using the computer controlled high speed vision system to inspect, monitor and control, at all appropriate and selected locations, the movement and location and orientation and marking and quality of workpieces and the operation of the machine during the execution of the method;

v) providing automated and integrated and controllable means for sequentially and controllably moving the individual workpieces precisely and accurately form the input supply containers to and through the various stations of the machine to the output supply containers; and w) providing automated and integrated and controllable means located at selected locations along the path of travel of the workpieces to be able to precisely and accurately and controllably stop, hold and release the individual workpieces, to provide controlled separation, holding and placement of the workpieces during the sequential operation of the machine and execution of the method.

9. The method recited in claim 8 wherein:

a) the step of singulating the workpieces wherein the workpiece is an integrated circuit device;

b) the step of orientating the integrated circuit device wherein the correct orientation for marking is the pin one position;

c) the step of applying an identification mark on the device includes providing an ink pad printing means which transfers an impression of the selected mark onto the substrate of the device; and d) the step of curing the identification mark includes providing an ultraviolet light, inclosed in a suitable oven.

10. The method recited in claim 8 wherein:

connecting the bulk inlet supply means and the bulk outlet supply means utilized in the execution of this method to input and output locations thereof.

11. The method recited in claim 8 wherein:

a) moving the singulated workpieces individually in a path form the input supply container, sequentially to and through the various operating elements and locations to the mark curing station, providing a generally horizontal track which is slightly wider than the workpiece and which has parallel sides extending slightly above a workpiece at rest thereon, with parallel shoulders on the track sides extending slightly inward toward each other to confine the vertical movement of the resting and moving workpieces;

b) the step of providing the wherein the surface has a plurality of parallel annular channels which extend angularly downward through the track, in a direction generally opposing the direction of movement of the workpieces along the track, to reach a plenum under the track which contains compressed air;

c) providing a blower and plenum means operably connected to the underside of the track to provide a controlled and continuous and even air flow through the plenum and angularly upward through the annular channels, sufficient to provide a resultant lifting and pushing of the workpieces, thus driving the workpieces along the track on a cushion of air while being constrained vertically by the shoulders on the sides of the track; and d) providing a movable track means used to move the workpieces through and form the curing station that is a stainless steel belt, driven by a pulley and which is operably connected and located in the curing station on one end and extending to the loading station on the opposing end.

12. The method cited in claim 8 wherein:

the step of orientating workpiece consists of a turntable, operably and controllably connected within the orientation station to controllably and horizontally rotate the workpiece about a vertical axis sufficiently to properly orient the workpiece for subsequent marking while the workpiece is being held in a stationary position by a suitable vacuum suction means applied to the underside of the workpiece through a suitable opening in the turntable means.

* * * * *